(12) United States Patent
Luo

(10) Patent No.: US 10,586,946 B2
(45) Date of Patent: Mar. 10, 2020

(54) OLED DISPLAY DEVICE AND METHOD OF PACKAGING THE SAME

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/976,490

(22) Filed: May 10, 2018

(65) Prior Publication Data

US 2019/0207144 A1 Jul. 4, 2019

(30) Foreign Application Priority Data

Jan. 3, 2018 (CN) .......................... 2018 1 0004660

(51) Int. Cl.
*H01L 29/08* (2006.01)
*H01L 51/52* (2006.01)
*H01L 51/56* (2006.01)

(52) U.S. Cl.
CPC ........ *H01L 51/525* (2013.01); *H01L 51/5243* (2013.01); *H01L 51/5246* (2013.01); *H01L 51/5253* (2013.01); *H01L 51/56* (2013.01)

(58) Field of Classification Search
CPC ............... H01L 51/525; H01L 51/5243; H01L 51/5246; H01L 51/5253; H01L 51/56
See application file for complete search history.

(56) References Cited

U.S. PATENT DOCUMENTS

| 7,759,864 B2 * | 7/2010 | Lee ..................... H01L 27/3251 257/59 |
| 2005/0189878 A1 * | 9/2005 | Shitagami ........... H01L 51/5246 313/512 |
| 2019/0067629 A1 * | 2/2019 | Wu ...................... H01L 51/5246 |

FOREIGN PATENT DOCUMENTS

| CN | 101090592 A | 12/2007 |
| CN | 206497907 U | 9/2017 |
| WO | WO-2016/204398 A1 | 12/2016 |

OTHER PUBLICATIONS

First Office Action for CN Appl. No. 201810004660.5, dated Dec. 18, 2019, 15 pages.

* cited by examiner

*Primary Examiner* — Victor A Mandala
*Assistant Examiner* — Colleen E Snow
(74) *Attorney, Agent, or Firm* — Foley & Lardner LLP; James F. Ewing; Paul M. H. Pua

(57) ABSTRACT

The present disclosure relates to an OLED display device and a method of packaging the OLED display device. An OLED display device, comprising: a substrate; a cover plate provided opposite to the substrate; a light emitting region located on a surface of the substrate facing the cover plate, wherein the light emitting region has an OLED display structure; a dam around the light emitting region; and a packaging adhesive layer disposed on the light emitting region and used to cover the OLED display structure, wherein the cover plate is provided with a groove at a position corresponding to the dam, an end of the dam away from the substrate being disposed in the groove.

9 Claims, 7 Drawing Sheets

OLED DISPLAY DEVICE AND METHOD OF PACKAGING THE SAME

CROSS-REFERENCE TO RELATED APPLICATIONS

The present application claims priority to Chinese Patent Application No. 201810004660.5 filed on Jan. 3, 2018, the disclosure of which is hereby incorporated by reference in its entirety.

FIELD

The present disclosure relates to the field of display technology, particularly to an OLED display device and a method of packaging the OLED display device.

BACKGROUND

Compared to LCD (liquid crystal display) devices, Organic Light-Emitting Diode (OLED) display devices have advantages such as thin, light, wide viewing angle, active light emission, continuous and adjustable light color, and low cost, fast response, low energy consumption, low driving voltage, wide operating temperature range, simple manufacturing process, and high luminous efficiency. OLED is expected to replace LCD and become the next generation of new flat panel display device.

Since electrodes and organic layers in OLED devices are liable to be corroded by water and oxygen, which may result in decreased life of the device, the OLED display panel needs to be packaged. In the prior art, the common packaging methods include chip adhesive packaging, Frit Seal packaging, and Dam and Fill packaging, etc.

DISCLOSURE

According to an embodiment of the present disclosure, an OLED display device is provided, comprising: a substrate; a cover plate provided opposite to the substrate; a light emitting region located on a surface of the substrate facing the cover plate, wherein the light emitting region has an OLED display structure; a dam around the light emitting region; and a packaging adhesive layer disposed on the light emitting region and configured to cover the OLED display structure, wherein, the cover plate is provided with a groove at a position corresponding to the dam, an end of the dam away from the substrate being received in the groove.

Further, a sealing layer may be provided between an inner wall of the groove and the dam.

Further, the dam may include a first sub-dam and a second sub-dam stacked on the first sub-dam, wherein the first sub-dam is disposed close to the substrate, and the second sub-dam is received in the groove. The first sub-dam may have a first surface, a portion of which is in contact with the second sub-dam and another portion of the first surface is in contact with the cover plate.

Further, the OLED packaging structure may further include a thin film packaging layer on one side of the packaging adhesive layer close to the OLED display structure. The thin film packaging layer may include at least a first inorganic barrier layer, a second inorganic barrier layer, and an organic barrier layer between the first inorganic barrier layer and the second inorganic barrier layer.

Further, the dam may include a first dam portion extending in a first direction and a second dam portion extending in a second direction different from the first direction. The first inorganic barrier layer may cover the first dam portion and the second inorganic barrier layer may cover the second dam portion. The first direction is not parallel with the second direction.

Further, a thin film removal region may be disposed between the dam and the light emitting region, no thin film packaging layer is provided in the thin film removal region, and the packaging adhesive layer is in contact with the substrate.

Further, the material of the sealing layer may include at least one of lead-antimony alloy, tin-antimony alloy, and metallic tin.

Further, the material of the first sub-dam may be the same as that of the second sub-dam.

According to another embodiment of the present disclosure, a method of packaging an OLED display device is provided, comprising: providing a substrate and a cover plate opposite to the substrate; forming a dam around the periphery of a light emitting region on the substrate, wherein an OLED display structure is provided in the light emitting region; forming a packaging adhesive layer covering the OLED display structure on one side of the dam close to the light emitting region; forming a groove on the cover plate at a position corresponding to the dam; and forming a sealing layer in the groove, and pressing the substrate against the cover plate so that the sealing layer is filled between an inner wall of the groove and the dam.

Further, the OLED display device may include a thin film packaging layer, the thin film packaging layer may comprise a first inorganic barrier layer, a second inorganic barrier layer, and an organic barrier layer between the first inorganic barrier layer and the second inorganic barrier layer; the dam may include a first dam portion extending in a first direction and a second dam portion extending in a second direction different from the first direction. After forming the dam and before forming the packaging adhesive layer, the method may further comprise: forming the first inorganic barrier layer covering the OLED display structure and the first dam portion; forming the organic barrier layer covering the OLED display structure; and forming the second inorganic barrier layer covering the OLED display structure and the second dam portion.

According to still another embodiment of the present disclosure, a display apparatus is provided, comprising the OLED display device according to the present disclosure.

DESCRIPTION OF THE DRAWINGS

In order to more clearly explain the embodiments of the present disclosure or the technical solutions in the prior art, a brief introduction will be given below for the drawings required to be used in the description of the embodiments or the prior art. It is obvious that, the drawings illustrated as follows are merely some of the embodiments of the present disclosure. For a person skilled in the art, he or she may also acquire other drawings according to such drawings on the premise that no inventive effort is involved.

DETAILED DESCRIPTION

Below, a clear and complete description will be given for the technical solution of embodiments of the present disclosure with reference to the figures of the embodiments. Obviously, merely some embodiments of the present disclosure, rather than all embodiments thereof, are given herein. All other embodiments obtained by those of ordinary skill in the art based on the embodiments of the present disclosure without creative efforts shall fall within the protection scope of the present disclosure.

The inventors of the present disclosure have recognized that in the prior art, when using the Dam and Fill packaging method, it is necessary to increase the dam width in order to improve the packaging effect. However, this may result in a larger periphery area of the display region, which is not conducive to the realization of a narrow frame design of the display device.

Figure 1:
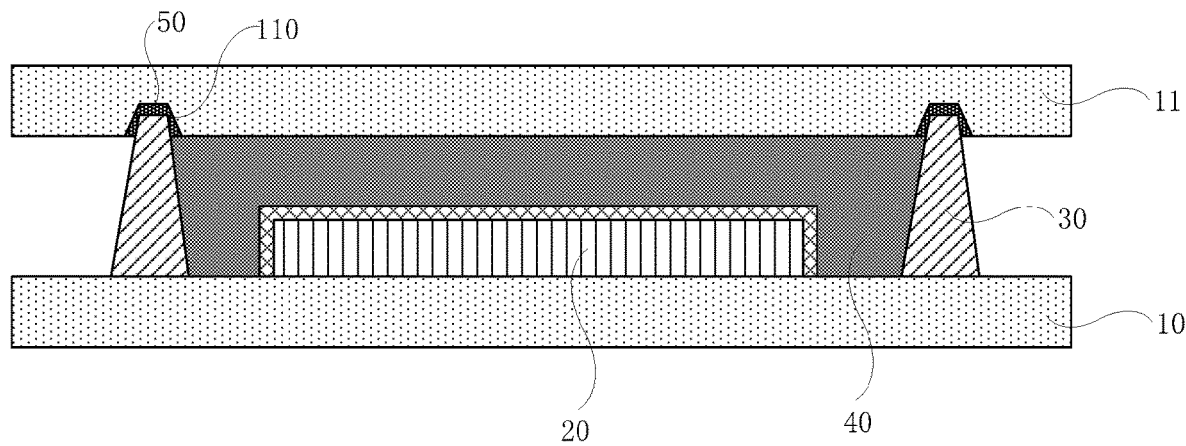
FIG. 1 is a schematic diagram of a packaging structure of an OLED display device according to an embodiment of the present disclosure.

According to an embodiment of the present disclosure, a packaging structure of an OLED display device is provided, comprising a substrate 10 and a cover plate 11 opposite to the substrate 10, as shown in FIG. 1.

Wherein, the material of the substrate 10 and the cover plate 11 may be, for example, a transparent material such as glass, quartz, or a rigid or flexible transparent resin material and the like, which is not limited in the present disclosure.

Figure 2:
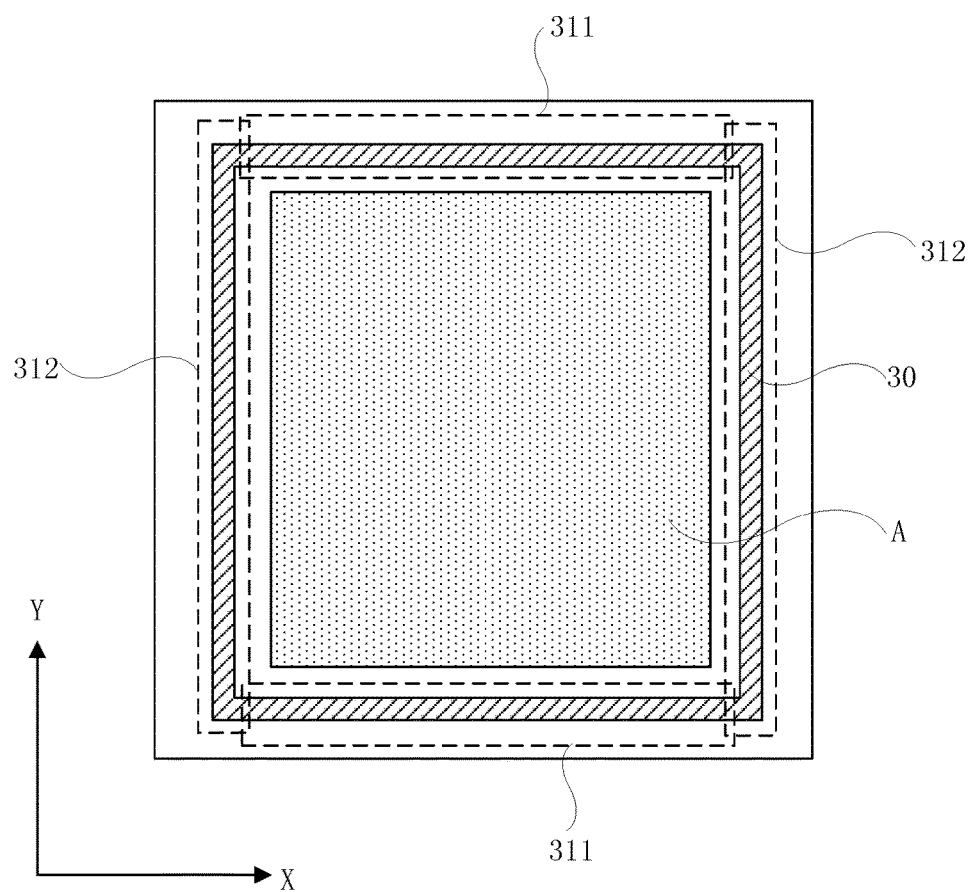
FIG. 2 is a top view of the structure of a dam shown in FIG. 1.

On this basis, a light emitting region A (as shown in FIG. 2) for disposing an OLED display structure 20 and a dam 30 surrounding the light emitting region A are provided on a surface of the substrate 10 facing the cover plate 11.

It should be noted that the above OLED display structure includes a pixel circuit formed on the substrate 10, a pixel definition layer (PDL) covering the pixel circuit, and a bottom electrode (for example, an anode electrode) in a groove on the pixel definition layer, organic material functional layers (a hole injection layer, a hole transport layer, an organic light emitting layer, an electron transport layer, an electron injection layer, etc.) and a top electrode (for example, a cathode electrode) covering the pixel definition layer, etc.

In addition, the shape of the longitudinal cross-section of the dam 30 may be a rectangle or a trapezoid as shown in FIG. 1, which is not limited in the present disclosure. The longitudinal cross-section is a cross-section obtained by cutting the dam 30 in a direction perpendicular to a first substrate.

On this basis, the above OLED packaging structure further includes a packaging adhesive layer 40 for covering the OLED display structure 20. As shown in FIG. 1, the packaging adhesive layer 40 is located above the light-emitting region A, specifically between the substrate 10 and the cover plate 11, and is located on one side of the dam 30 close to the light-emitting region A.

The above packaging adhesive layer 40 is used for bonding the substrate 10 to the cover plate 11. The material of the packaging adhesive layer 40 may be, for example, an ultraviolet curable resin adhesive or a thermosetting resin adhesive. For example, the resin adhesive may include one or more of: epoxy resins, glycidyl acrylate, glycidyl methacrylate, methyl methacrylate, ethyl methacrylate, n-butyl methacrylate, methyl 6,7-epoxy heptaerythyl, homopolymers or copolymers of monomers such as 2-hydroxyethyl methacrylate, melamine formaldehyde resins, unsaturated polyester resins, silicone resins, and furan resins, etc.

In addition, the adhesiveness of the packaging adhesive layer 40 may be in a range of 10 mPa·s to 2000 mPa·s. The inventors of the present disclosure have realized that when the adhesiveness of the packaging adhesive layer 40 is less than 10 mPa·s, the adhesion between the substrate 10 and the cover plate 11 is inadequate. When the adhesiveness of the packaging adhesive layer 40 is greater than 2000 mPa·s, uneven distribution of the packaging adhesive layer 40 is caused due to the lower diffusion of the packaging adhesive layer 40, thereby affecting the display effect.

The cover plate 11 is provided with a groove 110 at a position corresponding to the dam 30. One end of the dam 30 is located in the groove 110. The shape of the longitudinal cross-section of the groove 110 is the same as the shape of the longitudinal cross-section of the part of the dam 30 located in the groove 110.

Figure 3A:
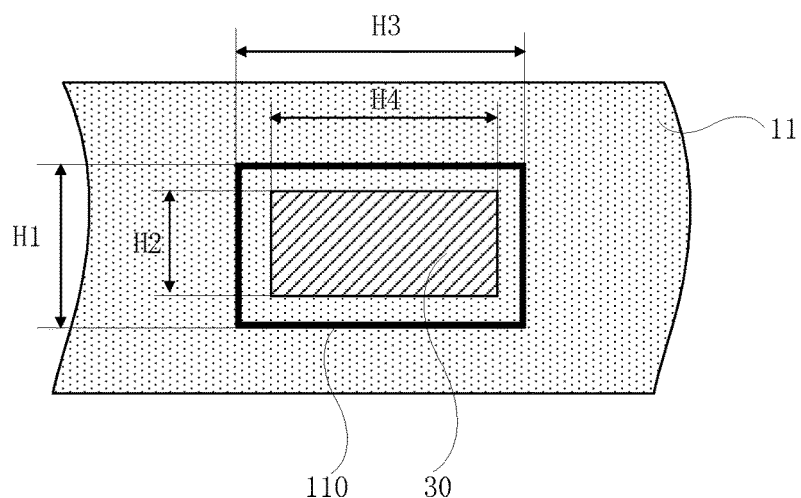
FIG. 3a is a lateral section view of the dam shown in FIG. 1.
Figure 3B:
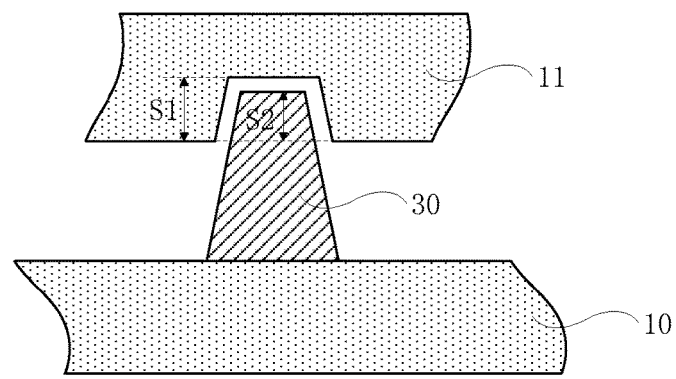
FIG. 3b is an enlarged view of the structure of the dam shown in FIG. 1.

Optionally, as shown in FIG. 3a, the size of the groove 110 may be greater than the size of the corresponding portion of the dam 30. For example, in the case where both of the lateral cross sections of the groove 110 and the dam 30 are rectangular, the width H1 of the groove 110 may be greater than the width H2 of the corresponding portion of the dam 30 located in the groove 110. For example, H1 is 5%-10% greater than H2. Similarly, the length H3 of the groove 110 may also be greater than the length H4 of the corresponding portion of the dam 30. For example, H3 is 5%-10% larger than H4. In addition, as shown in FIG. 3b, the depth S1 of the groove 110 may be greater than the depth S2 of the portion of the dam 30 located in the groove 110. For example, S1 is 10%-50% greater than S2.

In this way, on the one hand, there is a certain gap between the groove 110 and a corresponding portion of the dam 30 located in the groove 110, so as to prevent the situation that the cover plate cannot be press-fitted to substrate 10 due to alignment deviation occurred between the cover plate 11 and the substrate 10.

On the other hand, there is a sealing layer 50 formed of a sealing material between the inner wall of the groove 110 and the corresponding portion of the dam 30 in the groove 110. The gap between the groove 110 and the corresponding portion of the dam 30 located in the groove 110 may provide a diffusion space for the sealing material, so that the above sealing material may be evenly filled between any side of the corresponding portion of the dam 30 located in the groove 110 and a corresponding sidewall of the groove 110. The lateral sealing layer 50 can effectively seal the gap between the groove 110 and the corresponding portion of the dam 30 located in the groove 110, thereby achieving the purpose of improving the sealing performance.

On the other hand, a gap remains between the groove 110 and a corresponding portion of the dam 30 located in the groove 110. The gap can be used as a reserved buffer space to prevent the glue from breaching the dam when the packaging adhesive layer 40 is filled between the substrate 10 and the cover plate 11.

The material of the sealing layer 50 may be, for example, a sealant made of a resin material. Alternatively, in order to improve the sealing effect, the material of the sealing layer 50 may include at least one of a lead bismuth alloy (a melting point of about 120° C.), a tin bismuth alloy (having a melting point of about 140° C.), and metallic tin (having a melting point of about 230° C.), which has a relatively low melting point.

For example, in one embodiment according to the present disclosure, at least one of the above-mentioned lead bismuth alloy (having a melting point of about 120° C.), tin bismuth alloy (having a melting point of about 140° C.), metallic tin (having a melting point of about 230° C.) may be manufactured as a powder having a particle diameter of, for example, 1 μm to 10 μm, which then mixed with an organic alcohol such as methanol or ethanol to form a paste, and is fed into the above-mentioned groove 110 on the cover plate 11 by, for example, spraying or printing. The above paste formed in the groove 110 may be heated at 50° C.-120° C. (for example, about 80° C.) to remove the solvent, so that the metal filler may be evenly laid inside the groove 110.

After the packaging adhesive layer 40 covering the OLED display structure 20 is formed on the substrate 10, the dam 30 is aligned with the groove 110 and the substrate 10 is press-fitted to the cover plate 11, so that a portion of the dam 30 is located in the above groove 110. Next, the packaging adhesive layer 40 described above is cured, the cover plate 11 is turned over, and the metal filler is heated by a local heating process (e.g., a laser irradiation process), so that the metallic filler diffuses and forms the sealing layer 50.

It should be noted that when the material of the cover plate 11 is a resin material, it is necessary to perform heat insulation treatment at a position of the cover plate 11 corresponding to the groove 110, so as to avoid damage to the cover plate 11 during the process of heating the metal filler by a local heating process.

In summary, after the substrate 10 having a dam 30 formed thereon is press-fitted to the cover plate 11 on which a groove 110 is provided, a portion of the dam 30 is located in the groove 110, so that the groove 110 may lengthen a path of vapor and oxygen entering from the outside of the dam 30 to the interior of the dam 30, so as to improve the lateral barrier effect of the dam 30. On this basis, since there is a sealing layer 50 between the inner wall of the groove 110 and the corresponding portion of the dam 30 located in the groove 110, the sealing layer 50 may further block external vapor and oxygen, so as to reduce the possibility of corrosion damage to the internal components by vapor and oxygen entering the OLED packaging structure. On this basis, the OLED packaging structure provided by the embodiments of the present disclosure can achieve a good effect of blocking vapor and oxygen without increasing the thickness of the dam 30, so that the dam 30 does not need to occupy a large area of non-light emitting region, facilitating the realization of the requirement of narrow frame design.

In addition, it can be known from above that the OLED packaging structure provided by the embodiment of the present disclosure has a dam 30 and a packaging adhesive layer 40 for bonding the substrate 10 to the cover plate 11. Therefore, the packaging process using the OLED packaging structure is a Dam and Fill packaging method. In the present disclosure, the Dam and Fill packaging method not only has a good packaging effect, but also has advantages of simple production process, large size, and high light transmittance.

Figure 4:
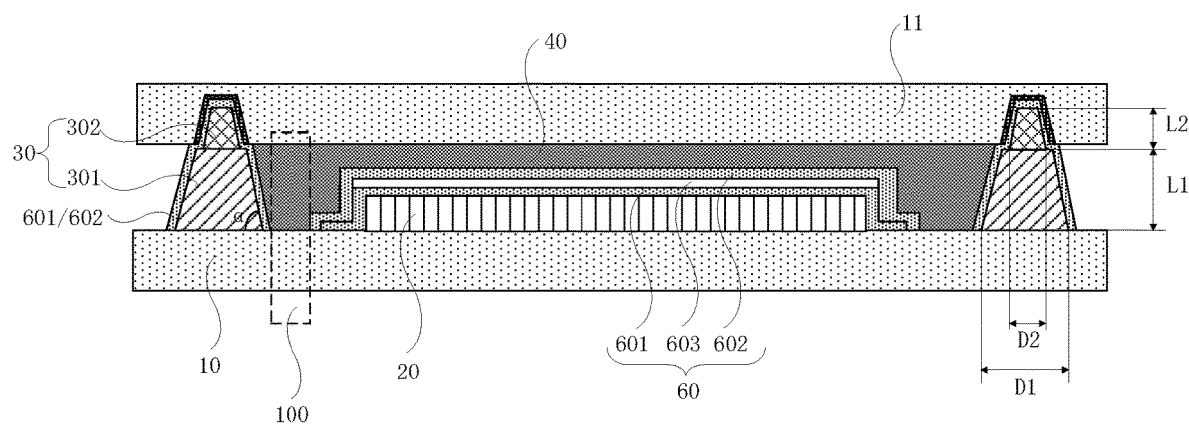
FIG. 4 is a schematic diagram of a packaging structure of another OLED display device according to an embodiment of the present disclosure.

FIG. 4 is a schematic diagram of a packaging structure of another OLED display device according to an embodiment of the present disclosure.

As shown in FIG. 4, the dam 30 includes a first sub-dam 301 and a second sub-dam 302 stacked on the first sub-dam 301.

The first sub-dam 301 is disposed close to the substrate 10, and the second sub-dam 302 is located in the groove 110.

The second sub-dam 302 is located on a first surface B of the first sub-dam 301. A portion of the first surface B is in contact with the second sub-dam 302, and another portion of the first surface B contacts the cover plate 11. Generally, the second sub-dam 302 may be disposed at a middle position of the first surface B of the first sub-dam 301. In this case, the peripheral portion of the first surface B is in contact with the cover plate 11, so that the first sub-dam 301 may be helpful to support the cover plate 11. In addition, through providing a peripheral portion in contact with the cover plate 11 on the first surface B of the first sub-dam 301, the path of external vapor and oxygen to the interior of the dam 30 can be further lengthened, thereby further improving the lateral barrier effect of the dam 30.

Optionally, the shape of the longitudinal interface between the first sub-dam 301 and the second sub-dam 302 may be a rectangle or a trapezoid as shown in FIG. 4. In addition, if the shape of the longitudinal interface between the first sub-dam 301 and the second sub-dam 302 is a trapezoid, the base angle α between the longer base and a side of the trapezoid may be 45° to 65°.

From the above, it can be seen that the volume of the first sub-dam 301 is generally larger than the volume of the second sub-dam 302. In an alternative example according to the present disclosure, the thickness D1 of the optional first sub-dam 301 may be, for example, 2 mm to 3 mm, and the height L1 may be, for example, 4 μm to 6 μm. The thickness D2 of the second sub-dam 302 may be, for example, 0.5 mm to 1.5 mm, and the height L1 may be, for example, 2 μm to 5 μm. In this way, the dam 30 may have good barrier properties, and a larger area of the non-light emitting region occupied by the dam 30 can be avoided, thereby facilitating the realization of the narrow frame design.

For ease of fabrication, the material of the first sub-dam 301 may be the same as that of the second sub-dam 302. For example, the material may include one or more of the following materials: benzocyclobutene (BCB), photoresist, phenol-based resin, polypropylene-based resin, polyimide-based resin, propylene-based resin, etc. The first sub-dam 301 and the second sub-dam 302 may be formed on the substrate 10 by a process such as spin coating, exposure, etching, etc.

In addition, as shown in FIG. 4, the OLED packaging structure may further include a thin film packaging layer 60 on the OLED display structure 20. The thin film packaging layer 60 is located on one side of the packaging adhesive layer 40 close to the OLED display structure 20. The thin film packaging layer 60 at least comprises, sequentially from the cover plate 10, a first inorganic barrier layer 601, an organic barrier layer 603, and a second inorganic barrier layer 602.

The material for forming the first inorganic barrier layer 601 may be the same as the material for forming the second inorganic barrier layer 602, and the material may include, for example, $SiN_x$, SiCN, $SiO_2$, SiNO, $Al_2O_3$, and the like. The first inorganic barrier layer 601 and the second inorganic barrier layer 602 may be formed by chemical vapor deposition (CVD), physical vapor deposition (PVD), atomic layer deposition (ALD), etc.

In addition, the material for forming the organic barrier layer 603 may include, for example, an acrylic-based polymer, a silicon-based polymer, or an epoxy-based polymer, etc. The organic barrier layer 603 may be formed on the first inorganic barrier layer 601 by, for example, printing, spin coating, spray coating, etc, and is photocured or thermal cured, for example, to form the organic barrier layer 603.

It should be noted that FIG. 4 illustrates the thin film packaging layer 60 as a three-layer structure. The thin film packaging structure 50 may also be an odd-numbered layer structure such as five or seven layer structure. For any thin-film packaging structure 50, the bottommost and outermost thin film layers are usually inorganic thin film layers. Between the bottommost and the outermost thin film layers, inorganic thin film layers and organic thin film layers can be alternately disposed.

In order to further improve the packaging effect of the OLED packaging structure, as shown in FIG. 4, optionally, the dam 30 may be covered by the first inorganic barrier layer 601 or the second inorganic barrier layer 602, such that the inorganic material forming the inorganic barrier layer 601 or the second inorganic barrier layer 602 may further increase the effect of the dam 30 blocking vapor and oxygen.

In addition, when the sealing layer 50 made of a metal material in the groove 110 is locally heated, the first inorganic barrier layer 601 or the second inorganic barrier layer 602 covering the surface of the dam 30 can protect the dam 30 and prevent damage to the dam 30 in a high temperature condition.

A process of covering the first inorganic barrier layer 601 or the second inorganic barrier layer 602 on the dam 30 will be described below.

As shown in FIG. 2, the dam includes two opposite dam portions 311 extending along the first direction X and two opposite dam portion 312 extending along the second direction Y. The dam portions 311 are joined to the adjacent dam portions 312 to form a dam 30 around the light emitting region A.

The first direction X is not parallel to the second direction Y. For a rectangular display device, the first direction X is perpendicular to the second direction Y.

Figure 5A:
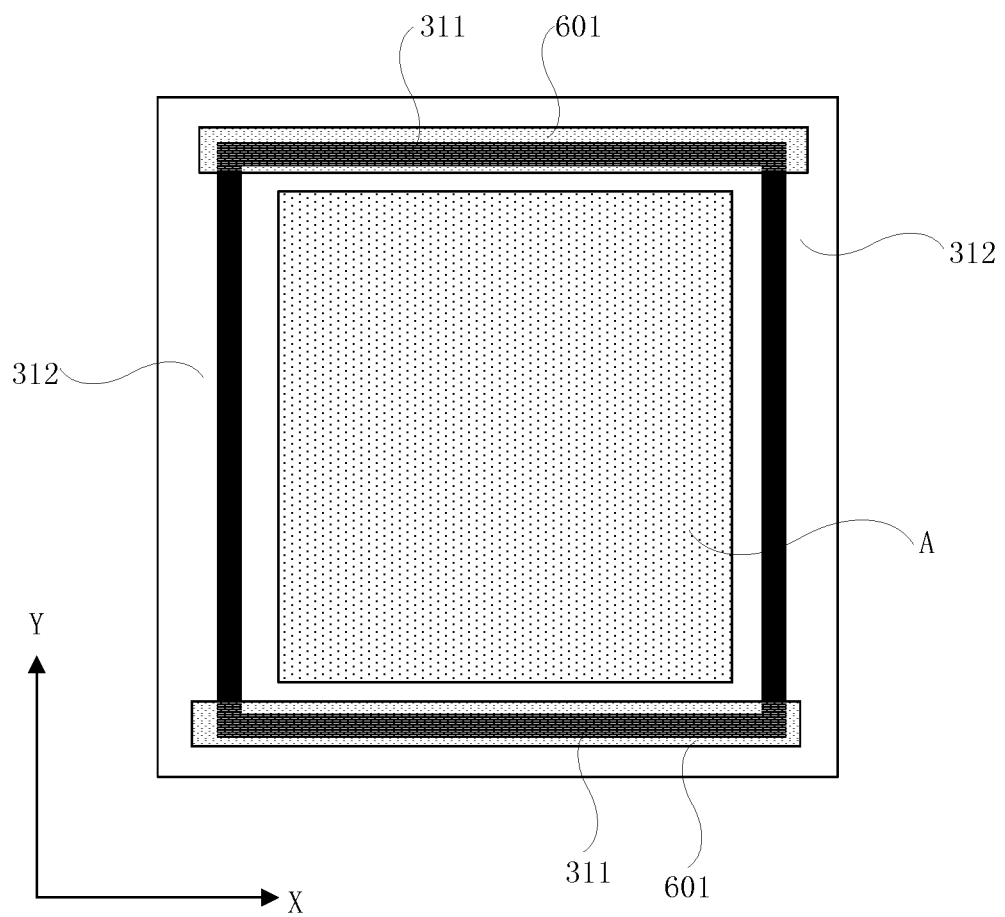
FIG. 5a is a schematic view of a first inorganic barrier layer shown in FIG. 4.

FIG. 5a is a schematic view showing the first inorganic barrier layer. As shown in FIG. 5a, the first inorganic barrier layer 601 covers the dam portion 311.

Figure 5B:
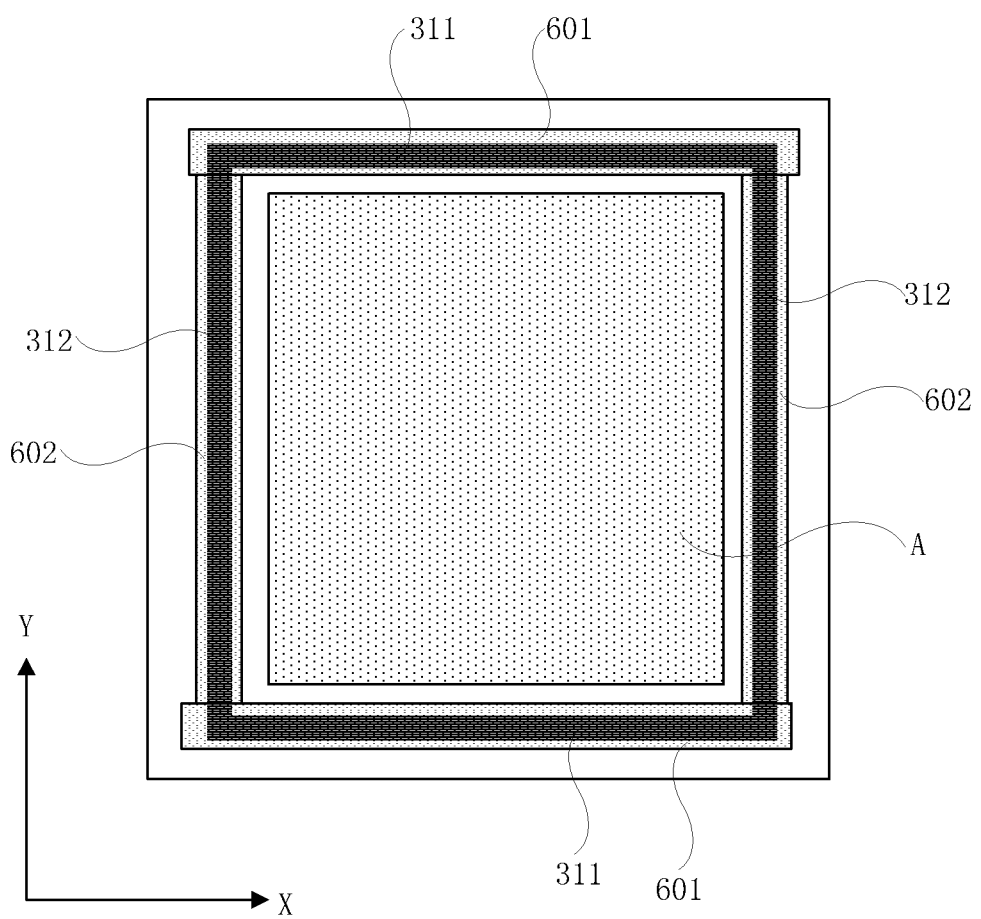
FIG. 5b is a schematic view of a second inorganic barrier layer shown in FIG. 4.

FIG. 5b is a schematic view showing the second inorganic barrier layer. As shown in FIG. 5b, the second inorganic barrier layer 602 covers the dam portion 312.

In one embodiment according to the present disclosure, optionally, as shown in FIG. 4, a thin film removal area 100 may be provided between the dam 30 and the light emitting region. The thin film packaging layer 60 is not provided in the thin film removal area 100, and the packaging adhesive layer 10 is in direct contact with the substrate 10. In this way, the adhesion between the substrate 10 and the cover plate 11 can be increased.

In one illustrative example, the distance between the dam 30 and the light emitting region A may be set to 3 mm to 5 mm, so that the thin film removal region 100 can be provided between the dam 30 and the light emitting region A.

In one embodiment of the present disclosure, the OLED display device may be applied to any product or component having a display function such as a display apparatus, a television, a digital photo frame, a digital camera, a mobile device (e.g., a mobile phone or a tablet computer, etc).

Figure 9:
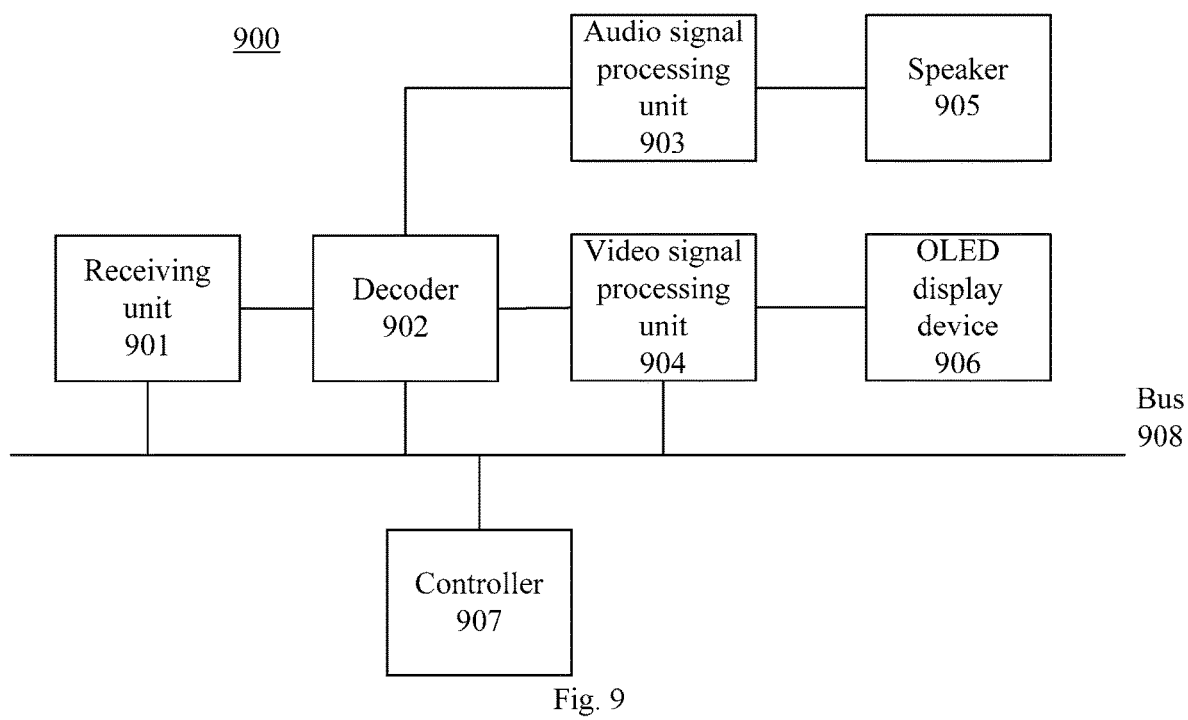
FIG. 9 shows a display apparatus according to an embodiment of the present disclosure.

FIG. 9 shows a display apparatus according to an embodiment of the present disclosure.

As shown in FIG. 9, the display apparatus 900 may comprise a receiving unit 901, a decoder 902, an audio signal processing unit 903, a video signal processing unit 904, a speaker 905, an OLED display device 906, a controller 907 and a bus 908.

The receiving unit 901 may receive input signals. The input signals may be transmitted via a cable or wirelessly.

The decoder 902 decodes the signals from the receiving unit 901 and obtains audio signal and video signals. Also, the decoder 902 sends the decoded audio signals to the audio signal processing unit 903, and sends the decoded video signals to the video signal processing unit 904.

The audio signal processing unit 903 plays back the audio signals and outputs audio from the speaker 905. The audio signal processing unit 903 performs playback processes such as D/A conversion and amplification on the audio signals input from the decoder 902. Also, the audio signal processing unit 903 may perform additional processes such as noise removal on the audio signals.

The video signal processing unit 904 plays back the video signals and causes the OLED display device 906 according to an embodiment of the present disclosure to display the video. The video signal processing unit 904 may perform additional processes such as noise removal, for example, on the video signals according to settings. Furthermore, the video signal processing unit 904 may generate graphical user interface (GUI) images such as menus, buttons, or a cursor, for example, and superimpose the generated images onto an output image.

The controller 907 includes a processor such as a central processing unit (CPU), and memory such as random access memory (RAM), and read-only memory (ROM). The memory stores a program to be executed by the CPU, program data, EPG data, data acquired via a network, and the like. The program stored in the memory is read and executed by the CPU when activating the display apparatus 900, for example. By executing the program, the CPU controls the operation of the display apparatus 900 according to an operation signal input from the receiving unit 901, for example.

The bus 908 interconnects the receiving unit 901, the decoder 902, the audio signal processing unit 903, the video signal processing unit 904, and the controller 907.

Figure 6:
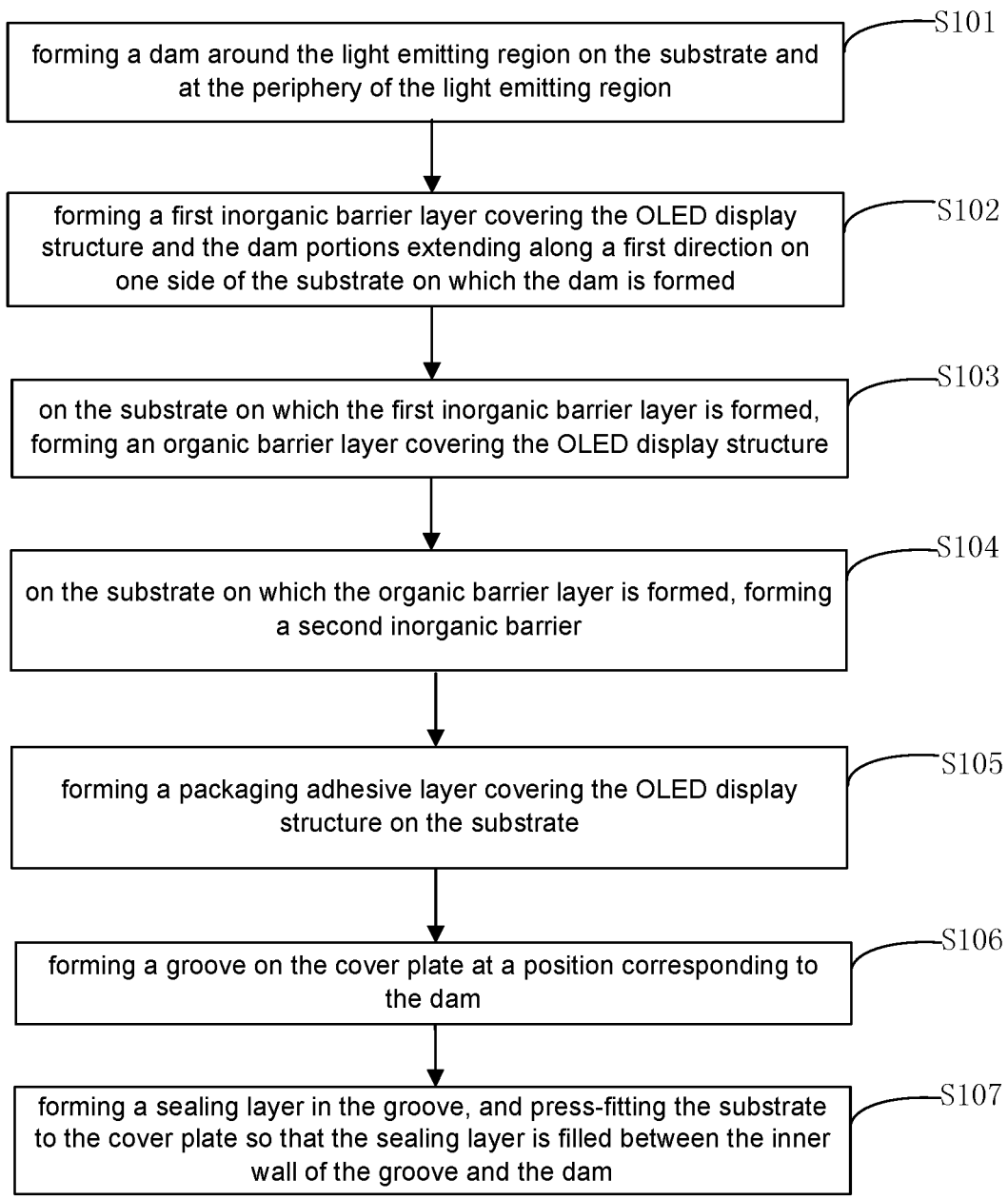
FIG. 6 is a flowchart of a method of packaging an OLED display device according to an embodiment of the present disclosure.

FIG. 6 is a flowchart of a method of packaging an OLED display device according to an embodiment of the present disclosure. As shown in FIG. 6, the method comprises:

S101. As shown in FIG. 2, forming a dam 30 around the light emitting region A on the substrate 10 and at the periphery of the light emitting region A.

An OLED display structure 20 may be formed in the light emitting region A by, for example, printing, vapor deposition, or the like.

The dam 30 around the light emitting region A is composed of two opposite dam portions 311 extending along the first direction X and two opposite dam portion 312 extending along the second direction Y.

In addition, when the structure of the dam 30 includes a first sub-dam 301 and a second sub-dam 302 as shown in FIG. 4, in one illustrative example, the height L1 of the first sub-dam 301 may be, for example, 5 μm, and its thickness D1 may be, for example, 3 mm; the height L2 of the second sub-dam 302 may be, for example, 22 and its thickness D2 may be, for example, 1 mm.

S102, forming a first inorganic barrier layer 601 covering the OLED display structure 20 and the dam portions 311 as shown in FIG. 5a on one side of the substrate 10 on which the dam 30 is formed.

In one illustrative example, a first inorganic barrier layer 601 having a thickness of 1 μm and made of SiNx is formed on a top electrode (e.g., a cathode electrode) in the OLED display structure 20 described above. In order to ensure the adhesion between the packaging adhesive layer 40 and the substrate 10, a thin film removal region 100 having a width of 3 mm is also formed between the dam 30 and the light emitting region A, in which the first inorganic barrier layer 601 is removed.

S103. on the substrate 10 on which the first inorganic barrier layer 601 is formed, forming an organic barrier layer 603 covering the OLED display structure 20.

S104. on the substrate 10 on which the organic barrier layer 603 is formed, forming a second inorganic barrier layer 602 covering the OLED display structure 20 and the dam portions 312 as shown in FIG. 5b.

In one illustrative example, the second inorganic barrier layer 602 may be formed of SiNx with a thickness of, for example, 1 μm. In addition, the second inorganic barrier layer 602 in the thin film removal region 100 is removed.

S105. forming a packaging adhesive layer 40 covering the OLED display structure 20 on the substrate 10. For example, the packaging adhesive layer 40 is located on one side of the substrate 10 where the dam 30 is formed, and is located on one side of the dam 30 close to the light emitting region A.

S106. forming a groove 110 on the cover plate 11 at a position corresponding to the dam 30.

S107. forming a sealing layer 50 in the groove 110, and press-fitting the substrate 10 to the cover plate 11 so that the sealing layer 50 is filled between the inner wall of the groove 110 and the dam 30.

Figure 7:
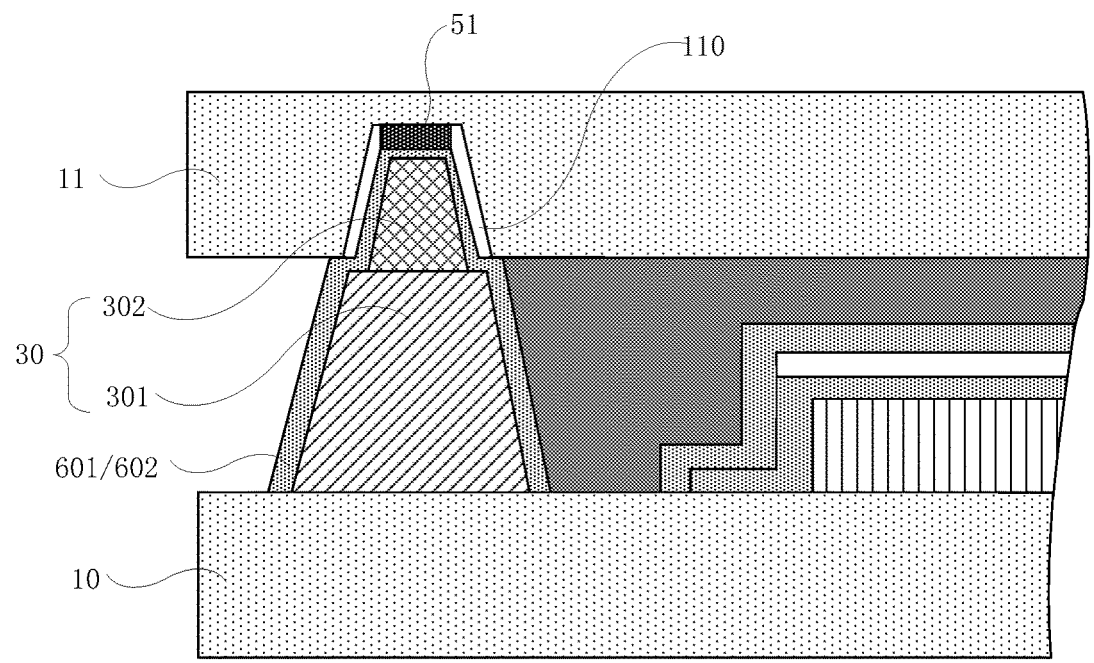
FIG. 7 is a schematic view of a metal filler formed on a cover plate shown in FIG. 4.

FIG. 7 is a schematic view of the metal filler formed on the cover plate. As shown in FIG. 7, a metal filler 51 is placed at the bottom of the groove 110. Then, the substrate 10 is press-fitted to the cover plate 11 to receive the second sub-dam 302 in the groove 110. The packaging adhesive layer 40 is then cured. The device is then flipped over so that the cover plate 11 faces upwards.

Figure 8:
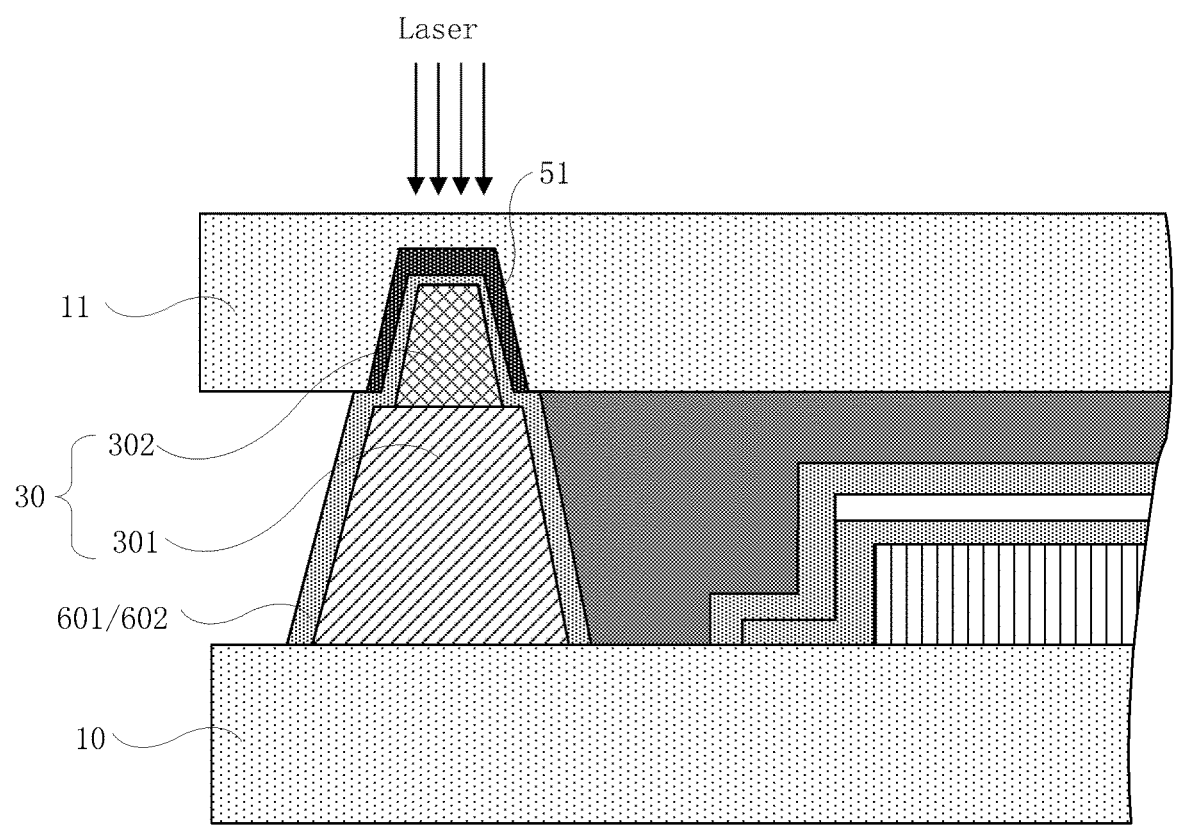
FIG. 8 is a schematic diagram of the metal filler in FIG. 7 after being local heated.

FIG. 8 is a schematic diagram of the metal filler after local heating. As shown in FIG. 8, the metal filler 51 in the groove 110 is heated by a laser, and the melted metal filler 51 fills up the gap between the side of the second sub-dam 302 and the inner wall of the groove 110 to form the sealing layer 50. Thus, the packaging process is completed.

The embodiments of the present disclosure provide an OLED display device and a packaging method thereof. In the packaging structure of the OLED display device, the substrate having a dam formed thereon is press-fitted to the cover plate on which a groove is provided, a portion of the dam is located in the groove, so that the groove may lengthen a path of vapor and oxygen entering from the outside of the dam 30 to the interior of the dam 30 (i.e., the light emitting region) to improve the barrier effect of the dam 30. On this basis, since there is a sealing layer between the inner wall of the groove and the corresponding portion of the dam located in the groove, the sealing layer may further block external vapor and oxygen, so as to reduce the possibility of corrosion damage to the internal components by vapor and oxygen entering the OLED packaging structure. On this basis, the OLED packaging structure provided by the embodiments of the present disclosure can achieve a good effect of blocking vapor and oxygen without increasing the thickness of the dam, so that the dam does not need to occupy a larger area of the non-light emitting region, facilitating the realization of the requirement of narrow frame design.

The disclosed above are only several specific embodiments of the present disclosure, however, the present disclosure is not limited to this. Any variation or replacement easily conceivable by those skilled in the art within the technical scope disclosed in the present disclosure shall fall within the protection scope of the present disclosure. Therefore, the protection scope of the present disclosure shall be determined by the terms of the claims.

What is claimed is:

1. An OLED display device, comprising:
   a substrate;
   a cover plate provided opposite to the substrate;
   a light emitting region located on a surface of the substrate facing the cover plate, wherein the light emitting region has an OLED display structure;
   a dam around the light emitting region; and
   a packaging adhesive layer disposed on the light emitting region and configured to cover the OLED display structure,
   wherein, the cover plate is provided with a groove at a position corresponding to the dam, an end of the dam away from the substrate being received in the groove,
   the dam includes a first sub-dam and a second sub-dam stacked on the first sub-dam, wherein the first sub-dam is disposed close to the substrate, and the second sub-dam is received in the groove, and
   the first sub-dam has a first surface, a portion of which is in contact with the second sub-dam and another portion of the first surface is in contact with the cover plate.

2. The OLED display device according to claim 1, wherein a sealing layer is provided between an inner wall of the groove and the dam.

3. The OLED display device according to claim 2, wherein a material of the sealing layer includes at least one of lead-antimony alloy, tin-antimony alloy, and metallic tin.

4. The OLED display device according to claim 1, comprising an OLED packaging structure including a thin film packaging layer on one side of the packaging adhesive layer close to the OLED display structure,
   wherein the thin film packaging layer includes at least a first inorganic barrier layer, a second inorganic barrier layer, and an organic barrier layer between the first inorganic barrier layer and the second inorganic barrier layer.

5. The OLED display device according to claim 4, wherein the dam includes a first dam portion extending in a first direction and a second dam portion extending in a second direction different from the first direction;
   the first inorganic barrier layer covers the first dam portion and the second inorganic barrier layer covers the second dam portion;
   wherein, the first direction is not parallel with the second direction.

6. The OLED display device according to claim 4, wherein a thin film removal region is disposed between the dam and the light emitting region,
   no thin film packaging layer is provided in the thin film removal region, and the packaging adhesive layer is in contact with the substrate.

7. The OLED display device according to claim 1, wherein the material of the first sub-dam is the same as that of the second sub-dam.

8. A display apparatus comprising the OLED display device according to claim 1.

9. A method of packaging an OLED display device, comprising:
- providing a substrate and a cover plate opposite to the substrate;
- forming a dam around the periphery of a light emitting region on the substrate, wherein an OLED display structure is provided in the light emitting region;
- forming a packaging adhesive layer covering the OLED display structure on one side of the dam close to the light emitting region;
- forming a groove on the cover plate at a position corresponding to the dam; and
- forming a sealing layer in the groove, and pressing the substrate against the cover plate so that the sealing layer is filled between an inner wall of the groove and the dam,
- wherein the OLED display device includes a thin film packaging layer, the thin film packaging layer comprises a first inorganic barrier layer, a second inorganic barrier layer, and an organic barrier layer between the first inorganic barrier layer and the second inorganic barrier layer; the dam includes a first dam portion extending in a first direction and a second dam portion extending in a second direction different from the first direction,
- after forming the dam and before forming the packaging adhesive layer, the method further comprises:
- forming the first inorganic barrier layer covering the OLED display structure and the first dam portion;
- forming the organic barrier layer covering the OLED display structure; and
- forming the second inorganic barrier layer covering the OLED display structure and the second dam portion.

* * * * *